(12) United States Patent
Sasaoka

(10) Patent No.: US 10,629,792 B2
(45) Date of Patent: Apr. 21, 2020

(54) WIRING SUBSTRATE AND PRODUCTION METHOD THEREOF

(71) Applicant: Panasonic Intellectual Property Management Co., Ltd., Osaka (JP)

(72) Inventor: Tatsuo Sasaoka, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/003,802

(22) Filed: Jun. 8, 2018

(65) Prior Publication Data

US 2018/0366628 A1 Dec. 20, 2018

(30) Foreign Application Priority Data

Jun. 19, 2017 (JP) .................................. 2017-119216
Mar. 26, 2018 (JP) .................................. 2018-057379

(51) Int. Cl.
*H01L 33/64* (2010.01)
*H01L 23/373* (2006.01)

(52) U.S. Cl.
CPC .......... *H01L 33/641* (2013.01); *H01L 33/647* (2013.01); *H01L 23/3735* (2013.01)

(58) Field of Classification Search
CPC .. H01L 33/641; H01L 33/647; H01L 23/3735
See application file for complete search history.

(56) References Cited

U.S. PATENT DOCUMENTS

| 2007/0224781 | A1 | 9/2007 | Watanabe | |
|---|---|---|---|---|
| 2015/0014672 | A1* | 1/2015 | Yamae | H05B 33/04 257/40 |
| 2015/0307717 | A1* | 10/2015 | Kojima | H01L 33/60 257/98 |
| 2015/0311417 | A1* | 10/2015 | Horikawa | H01L 33/60 257/98 |

FOREIGN PATENT DOCUMENTS

| JP | 2005-166868 | 6/2005 |
|---|---|---|
| JP | 2007-258590 | 10/2007 |

* cited by examiner

*Primary Examiner* — Marc Anthony Armand
(74) *Attorney, Agent, or Firm* — McDermott Will & Emery LLP

(57) ABSTRACT

Wiring substrates include: an insulation resin layer; a conductor-wiring layer that is placed on a surface of the insulation resin layer; and a metal substrate that is placed on an opposite surface of the insulation resin layer and that covers an edge of the insulation resin layer. Also, methods for producing a wiring substrate include: (i) forming a recess on a wiring substrate including a conductor-wiring layer, an insulation resin layer, and a metal substrate that are stacked; and (ii) cutting at least a part of the recess of the wiring substrate by using at least one die to form at least one separated piece of the wiring substrate in which a part of an edge of the insulation resin layer is covered by the metal substrate.

9 Claims, 7 Drawing Sheets

WIRING SUBSTRATE AND PRODUCTION METHOD THEREOF

TECHNICAL FIELD

The technical field relates to wiring substrates, and production methods thereof.

BACKGROUND

In recent years, demand for energy savings has increased, and thus, electronic devices such as power semiconductors and LEDs (Light Emitting Diodes) for purposes of reducing power consumption have progressively been popularized.

In such electronic devices, the number of devices mounted in the modules are reduced because of enhanced demands for miniaturization of casing sets, and ease of electric or optical design.

Thus, an amount of power assigned to each of the elements is increased.

As a result, a problem of enhanced heat generation from the elements arises.

Therefore, great importance has been attached to the provision of higher heat-radiation capabilities in order to secure reliability of the products.

Under such a background, wiring substrates with higher heat-radiation capabilities, in particular, high-heat-radiation substrates including metal bases, and resin wiring substrates combined therewith, have been developed (e.g., JP-A-2007-258590 and JP-A-2005-166868).

Such heat-radiation substrates including metal bases have a structure in which metal plates serving as heat-radiation parts, and the resin wiring substrates including electric wiring layers are adhered to each other.

In general, large-sized metal plates, and resin wiring substrates are adhered to each other, and the resulting materials are cut into separate pieces of desired sizes.

With regards to the method for cutting the materials into separate pieces, cutting techniques such as router machining, and shearing techniques using dies would generally be employed, as shown in JP-A-2007-258590.

However, when a large number of substrates need to be produced, and thus, high production capabilities are required, die-based shearing would be more effective in reducing costs.

In die-based shearing, burrs and warpages are formed on the surfaces of the metal bases.

When heat-radiation fins and the like are further placed on a heat-generation substrate equipped with electronic parts, through a heat-radiation grease, the grease thickness will be large due to the burrs and warpages.

As a result, the heat-radiation properties will be deteriorated.

For this reason, in cases where shearing is carried out, the punching direction is restricted to one direction, and thus, a direction in which burrs and warpages are formed is prevented from becoming a surface on which electronic parts are mounted, as shown in JP-A-2005-166868.

SUMMARY

A step of cutting a substrate into separate pieces based on conventional shearing is described in FIGS. 5A-5C.

An unmachined substrate 100 shown in FIG. 5A is punched with a punching die 13 while the combined substrate 100 is supported by a die 14 from underneath, as shown in FIG. 5B.

As a result, a separate substrate 30 shown in FIG. 5C is formed.

A cross-section of the entire body of the punched separate piece of substrate 30 is shown in FIG. 6A.

The separate substrate 30 is formed of a conductor-wiring layer 1, an insulation resin layer 2, and a metal substrate 3.

Furthermore, an enlarged cross-section of an edge of the separate piece of substrate 30 is shown in FIG. 6B.

Around the edge of the metal substrate 3, a warpage of the metal substrate 3 is formed.

According to the presence of such a warpage, a structure in which the insulation resin layer 2 and the metal substrate 3 are unified is formed.

However, there is the following problem associated with product reliability. That is, the above-described heat-radiation substrate equipped with electronic parts repeatedly generating heat is subjected to repeated elevations and declines of heat.

In this case, heat stress will be caused due to differences between linear expansion coefficients of the insulation resin layer 2 and the metal substrate 3.

Furthermore, when warpages of the metal substrate 3 are present, vertical forces will be applied to the insulation resin layer 2.

Consequently, detachment of the insulation resin layer 2 from the metal substrate 3 occurs. This influences the heat-radiation properties and insulation properties, and thus, the heat-radiation substrate will not be able to satisfy the quality requirements anymore.

Therefore, in order to solve the above-mentioned problem, an object of the disclosure is to provide wiring substrates that make it possible to suppress the occurrence of detachment of the resin parts from the metal parts, even if burrs and warpages are formed through punching-based shearing as a result of emphasizing productivity, and production methods thereof.

In order to solve the above-mentioned problem, according to one aspect of the disclosure, provided are wiring substrates, including: an insulation resin layer; a conductor-wiring layer that is placed on a surface of the insulation resin layer; and a metal substrate that is placed on an opposite surface of the insulation resin layer and that covers an edge of the insulation resin layer.

Furthermore, according to another aspect of the disclosure, provided are methods for producing a wiring substrate, including: (i) forming a recess on a wiring substrate including a conductor-wiring layer, an insulation resin layer, and a metal substrate that are stacked; and (ii) cutting at least a part of the recess of the wiring substrate by using at least one die to form at least one separated piece of the wiring substrate in which a part of an edge of the insulation resin layer is covered by the metal substrate.

According to the wiring substrates and the production methods thereof, it becomes possible to suppress occurrence of detachment of the resin parts from the metal parts, thereby realizing high reliability, even if the wiring substrates are produced through punching-based shearing that realizes excellent productivity.

DESCRIPTION OF EMBODIMENTS

Hereinafter, embodiments will be described in detail with reference to the drawings.

In the embodiment described below, substantially same elements may be referred to by the same reference symbols, and descriptions thereon may be omitted.

All of the embodiments described below are merely examples.

Numerical values, shapes, materials, components, arrangements/positions and connection configurations of components, steps, orders of steps, etc. are also merely examples, and the disclosure is not limited thereto.

Furthermore, among components in the embodiments described below, those not described in independent claims should be interpreted as optional components.

Redundant detailed descriptions may be omitted.

For example, detailed descriptions on well-known matters, and overlapping descriptions on substantially same elements may be omitted.

This is because unnecessarily redundant descriptions should be avoided in order to facilitate those skilled in the art to easily understand the descriptions.

In addition, the attached drawings and the following descriptions merely facilitate those skilled in the art to sufficiently understand the present disclosure, and therefore, do not restrict the scope of the claims.

First Embodiment

<Structure>

Hereinafter the first embodiment of the disclosure will be described with reference to FIGS. 1A-1E.

Figure 1A:
FIG. 1A is a cross-section view of a wiring substrate according to a first embodiment.
Figure 1B:
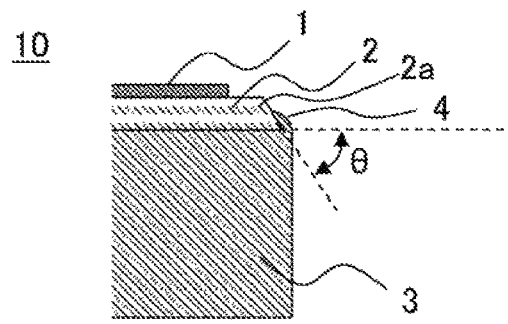
FIG. 1B is an enlarged view that shows an edge of the wiring substrate according to the first embodiment.

FIGS. 1A and 1B schematically illustrate a structure of a wiring substrate 10 according to the first embodiment. That is, FIG. 1A is a schematic cross-section view of the wiring substrate 10, and FIG. 1B is an enlarged cross-section view of an edge of the wiring substrate 10.

In FIG. 1A, the wiring substrate 10 includes: a conductor-wiring layer 1 that is formed for the purpose of electrically connecting electronic parts; and an insulation resin layer 2 formed between the conductor-wiring layer 1 and a metal substrate 3.

Electronic parts are connected onto the conductor-wiring layer 1 based on soldering or the like.

Therefore, the conductor-wiring layer 1 is subjected to plating based on gold, ting, and the like, in order to secure sufficient solder wettability generally against copper wires.

Furthermore, in order to avoid excess wet-spreading properties of solder, resins serving as solder resists or the like may be present on the conductor-wiring layer 1.

The conductor-wiring layer 1 may have a configuration in accordance with general resin wiring substrates.

Moreover, in general, the insulation resin layer 2 may be made of an industrial plastic material including an epoxy resin, and materials with low linear expansion coefficients (e.g., glass cloths, aramid fibers, silica, and alumina) may be combined with the plastic material, in order to suppress expansion caused at high temperature.

Furthermore, the metal substrate 3 may be made of copper, aluminum, or alloys of these metals for general heat-radiation purposes, and also, alloys in combination with molybdenum or tungsten may be employed to combine favorable heat conductivity and low expansion properties.

An enlarged view of an edge of the wiring substrate 10 is shown in FIG. 1B.

An edge of the insulation resin layer 2 forms an inclined surface 2a that has a certain angle against a vertical direction of the edge of the metal substrate 3, or top and bottom surfaces of the insulation resin layer 2, a lower part of the edge is covered with a gripping part 4 that is a part of the metal substrate 3.

That is, a structure in which a part of the metal substrate 3 covers apart of the inclined surface 2a of the edge of the insulation resin layer 2 is provided.

A thickness of the insulation resin layer 2 may be about 80 μm.

The inclined surface 2a of the edge of the insulation resin layer 2 may form an angle of about 45 degrees against the vertical direction of the edge of the metal substrate 3, or top and bottom surfaces of the insulation resin layer 2.

A height of the gripping part 4 may be about 10-60 μm.

In this case, the angle θ is preferably from about 1 degree to less than about 90 degrees.

The gripping part 4 preferably covers about 10% to less than about 100% of the inclined surface 2a.

The level of the gripping part 4 is preferably equivalent or lower than the level of the top surface of the insulation layer 2.

When the level of the gripping part 4 is higher than the level of the top surface of the insulation layer 2, it is preferable that the gripping part 4 is not in contact with the conductor layer 1 in a planar configuration.

The gripping part 4 is preferably located at least 0.5 mm away from the conductor layer 1 in consideration of thermal expansions of these members.

According to the presence of the gripping part 4, it becomes possible to prevent detachment of the insulation resin layer 2 from the metal substrate 3 because the gripping part 4 fastens the insulation resin layer 2 and the metal substrate 3 therein, even when detachment of the insulation resin layer 2 from the metal substrate 3 is likely to occur due to a difference between linear expansion coefficients of these members.

Furthermore, the gripping part 4 is preferably formed along an entire periphery of an edge of the separate piece of the wiring substrate 10 according to the first embodiment.

However, gripping parts 4 may be formed only around corners (FIG. 1D) where the detachment would likely occur.

Additionally, gripping parts 4 may be formed only in parts on which heat-producing components are mounted and which would thus expand to a large extent because of the produced heat.

Figure 1C:
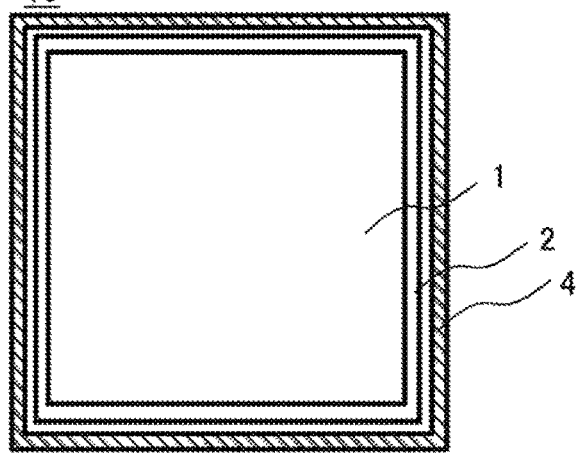
FIGS. 1C-1E are plan views of the wiring substrate according to the first embodiment.
Figure 1D:
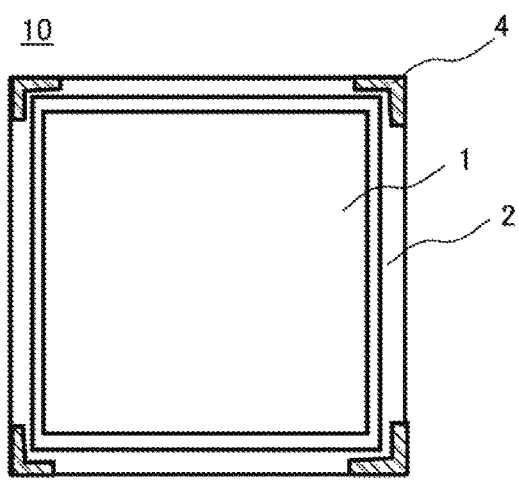
Figure 1E:
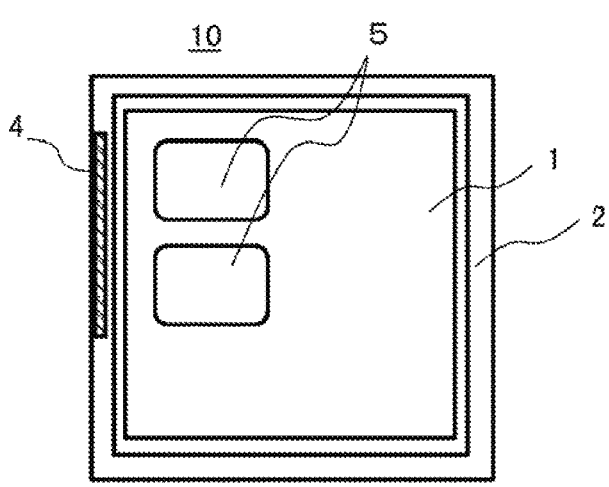

FIGS. 1C to 1E are plan views of wiring substrates 10.

In FIG. 1C, a gripping part 4 is present along the entire periphery of the wiring substrate 10.

In FIG. 1D, gripping parts 4 are present around the corners.

Gripping parts 4 may be present only around the corners.

In FIG. 1E, a gripping part 4 is located at an edge of the wiring substrate 10 in the vicinities of the heat-producing components 5.

The gripping part 4 may be located only in the vicinities of the heat-producing components 5.

Moreover, positions of gripping part 4 may be set to either the entire circumference or parts of the wiring substrate 10, by way of changing locations where clearance is provided as described below.

Furthermore, the gripping part 4 never extends beyond the top surface of the insulation resin layer 2.

This is because the top surface is fasted with a punching die 13, as described below.

Additionally, heat-producing components 5 may be LEDs or the like.

The wiring substrate 10 may serve as a substrate for an LED headlight for vehicles.

In addition, heat-producing components 5 may be heat-producing elements such as LEDs, laser diodes, or power devices.

The wiring substrate 10 may be a module substrate on which multiple heat-producing components 5 may be mounted.

The wiring substrate 10 may be a wiring substrate used in, for example, a vehicle LED headlight, an airplane warning light for buildings, a high-intensity searchlight, and a light-emitting part provided in large projectors.

<Production Method>

Next, a method for producing the wiring substrate according to the first embodiment will be described with reference to FIGS. 2A to 2D.

Figure 2A:
FIGS. 2A-2D are cross-section views that describe a method for producing the wiring substrate according to the first embodiment.

In FIG. 2A, a combined substrate 100 has a size of a substrate that has not yet been cut into separate pieces, and the size may typically be from about 100 mm to about 300 mm. A thickness of an insulation resin layer may be about 80 μm, and a thickness of a metal plate may be about 1.5 mm. These members would basically be made of the materials as the terms each indicate.

Additionally, the conductor-wiring layer 1 shown in FIG. 1A is omitted in FIG. 2A to 2D for the sake of shorthand.

Figure 2B:
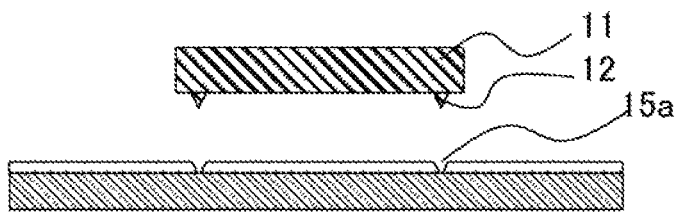

At first, as shown in FIG. 2B, a recess-forming die 11 with a ridge 12 is pressed onto the combined substrate 100, and thus, a recess 15a is formed in the combined substrate 100.

A shape of the ridge 12 may have an angle from about 1 degree to less than about 90 degrees against the pressing direction.

As an example, a recess-forming die 11 may be scraped to have a ridge 12 that has a shape with a height of about 80 μm and an angle of about 45 degrees.

By using such a recess-forming die 11, a recess 15a with a certain angle can be formed on the insulation resin layer 2.

Figure 2C:
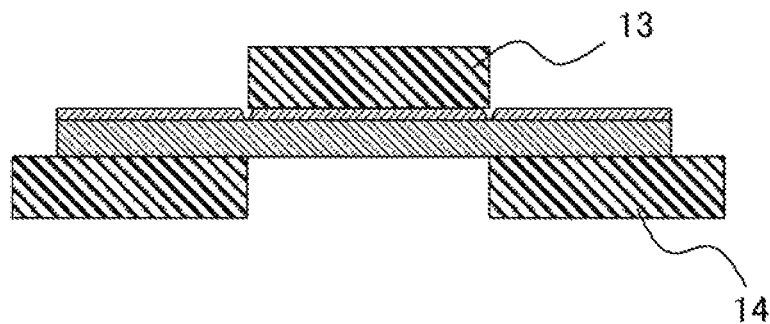

Next, as shown in FIG. 2C, the combined substrate 100 is punched with a punching die 13 while it is supported by a die 14.

In that case, sites of the combined substrate cut by the punching die 13 and the die 14 is adjusted to coincide with locations where recesses 15a are present, and, as a result, warped parts of the metal substrate 3 formed through the shearing process cover inclined surfaces of the recesses of the insulation resin layer 2.

Figure 2D:
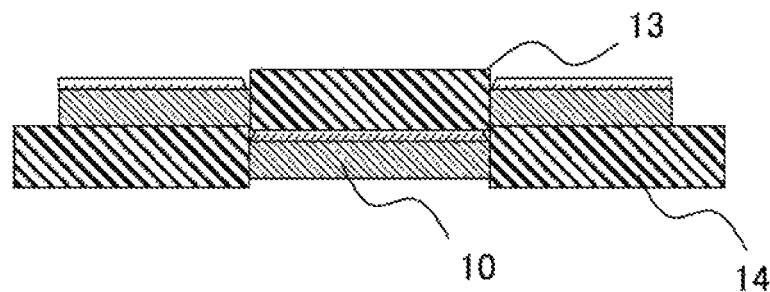

As a result, as shown in FIG. 2D, a separate piece of wiring substrate 10 is formed, and a gripping part 4 (FIG. 1B) is formed therein.

In this embodiment, the clearance is about 75 μm.

Such a value is an appropriate clearance value when a thickness of the metal substrate is about 1.5 mm, and the metal substrate is made of copper.

Additionally, a forming level and a forming location of the gripping part 4 can be controlled based on clearances of the punching die 13 and the die 14.

For example, the clearances may be increased, and increased amounts of flowable materials may be employed, in order to increase the level of the gripping part 4.

Second Embodiment

<Structure>

Hereinafter the second embodiment of the disclosure will be described with reference to FIGS. 3A and 3B.

Figure 3A:
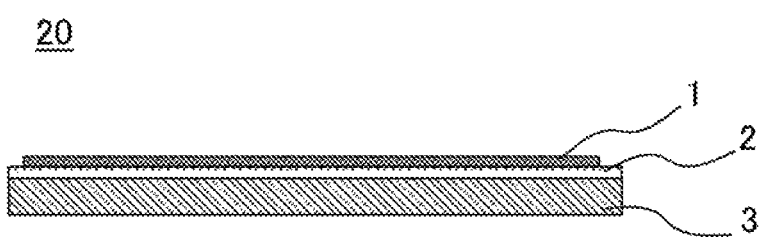
FIG. 3A is a cross-section view of a wiring substrate according to a second embodiment.

FIG. 3A is a cross-section view of a wiring substrate 20.

Figure 3B:
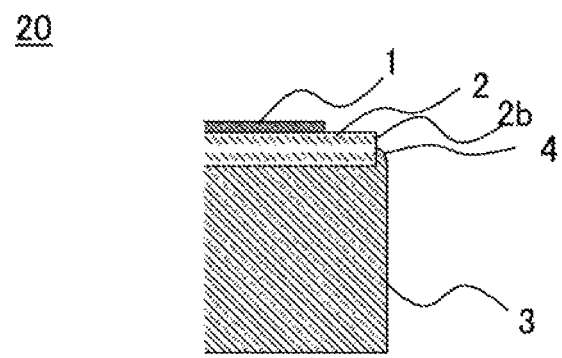
FIG. 3B is an enlarged view that shows an edge of the wiring substrate according to the second embodiment.

FIG. 3B is an enlarged cross-section view of an edge of the wiring substrate 20.

Matters not mentioned in this embodiment may be the same as those described in the first embodiment.

One feature of the wiring substrate 20 according to this embodiment is that a vertical surface 2b is provided in an edge of the insulation resin layer 2, such that the edge of the insulation resin layer 2 is substantially parallel with an edge of a metal substrate 3 or is substantially vertical to top and bottom surfaces of the insulation resin layer 2.

Another feature of the wiring substrate 20 according to this embodiment is the insulation resin layer 2 is fastened by the gripping part 4 of the metal substrate 3 from the lateral direction.

By adopting such a structure, the wiring substrate 20 would be released from fastening in the vertical direction as compared with the first embodiment, and therefore, occurrence of detachment of the insulation resin layer 2 is prevented only based on fastening in the lateral direction.

Furthermore, an appearance of the wiring substrate 20 viewed from the planar direction will be superior.

In other words, there would only be a few variations among produced multiple wiring substrate 20 with regards to areas of the insulation resin layers 2 covered by gripping parts 4.

In FIG. 1B illustrating the first embodiment, the edge of the insulation resin layer 2 is inclined. Therefore, when multiple wiring substrates are produced according to the first embodiment, areas of insulation resin layers 2 covered by gripping parts 4 may be more likely to vary.

<Production Method>

Next, a method for producing the wiring substrate according to the second embodiment will be described with reference to FIGS. 4A to 4D.

Figure 4A:
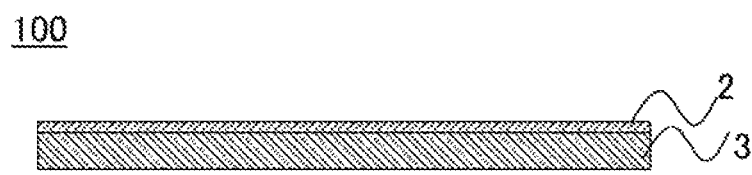
FIGS. 4A-4D are cross-section views that describe a method for producing the wiring substrate according to the second embodiment.

In FIG. 4A, the combined substrate 100 is a large size substrate that has not yet been cut into separate pieces.

The combined substrate 100 may have the same size, and may be made of the same material, as those described in the first embodiment.

In addition, the conductor-wiring layer 1 shown in FIGS. 3A and 3B is omitted in FIGS. 4A to 4D for the sake of simplicity.

Figure 4B:
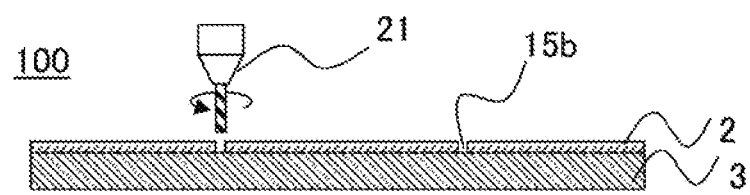

At first, as shown in FIG. 4B, a recess 15b is formed on the combined substrate 100 based on shearing work using a router 21 or the like.

In this embodiment, a router diameter may be about 6 mm, the tip shape thereof may be flat, and the corner may have a radius of about 0.2 mm.

As an example, an insulation resin layer with a thickness of about 80 μm is employed, and a cut depth of about 90 μm may be adopted, such that the cutting region extends to the metal plate 3.

In this case, tools for forming a recess 15b include not only a router 21 but also laser beams or blades.

Figure 4C:
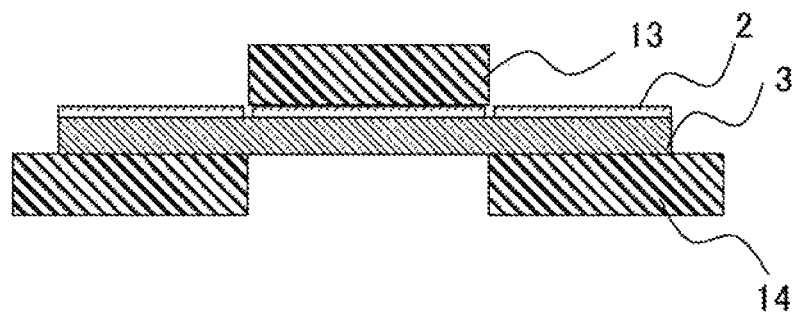

Next, as shown in FIG. 4C, the combined substrate 100 is punched with a punching die 13 while the combined substrate 100 is supported by a die 14.

In that case, sites of the combined substrate 100 cut by the punching die 13 and the die 14 is adjusted to coincide with locations where recesses 15b are present.

Accordingly, the griping part 4 formed in the metal substrate 3 through the shearing process comes into contact with a lateral surface of the insulation resin layer 2.

Figure 4D:
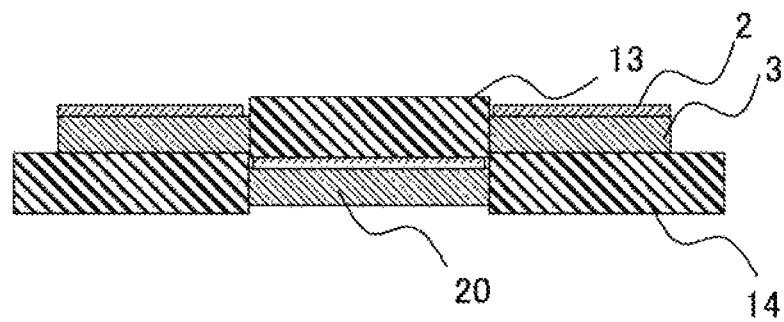
Figure 5A:
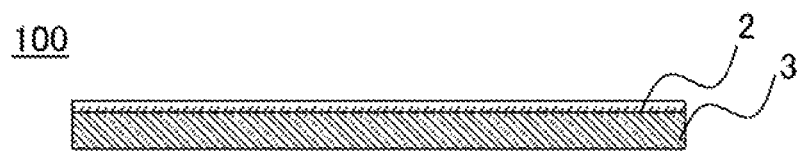
FIGS. 5A-5C are cross-section views that describe a method for producing a wiring substrate according to a conventional art.
Figure 5B:
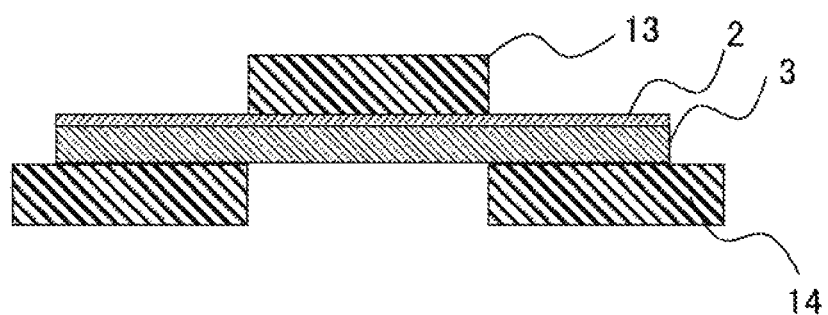
Figure 5C:
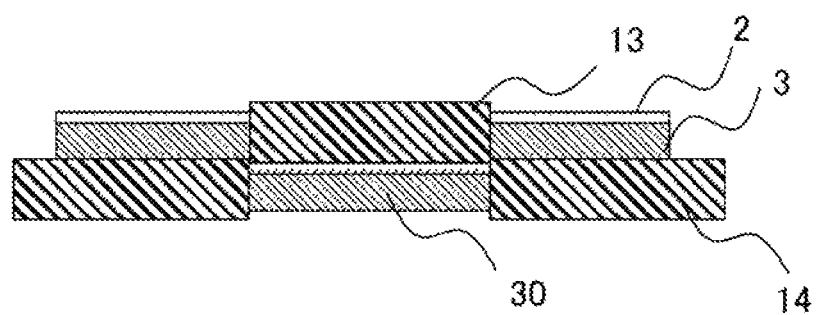
Figure 6A:
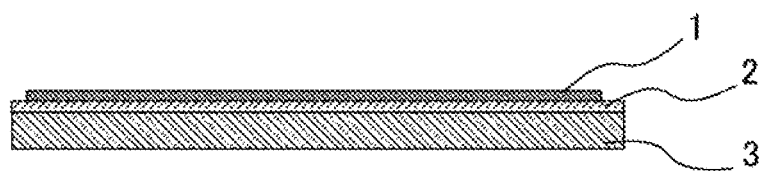
FIG. 6A is a cross-section view of the wiring substrate according to the conventional art.
Figure 6B:
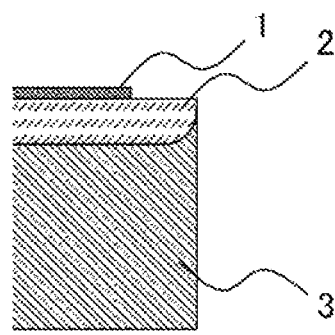
FIG. 6B is an enlarged view that shows an edge of the wiring substrate according to the conventional art.

As a result, as shown in FIG. 4D, a separate piece of wiring substrate 20 is produced, and the gripping part 4 shown in FIG. 3B is formed therein.

(Overall)

Although wiring substrates, and methods for producing wiring substrates according to one or more aspects of the disclosure are described above, the disclosure is not limited to the above embodiments.

The disclosure includes those configured by adopting various variations conceived by those skilled in the art in the above embodiments, and those configured combining elements in different embodiments without departing from the spirit and the scope of the disclosure.

Figure 7:
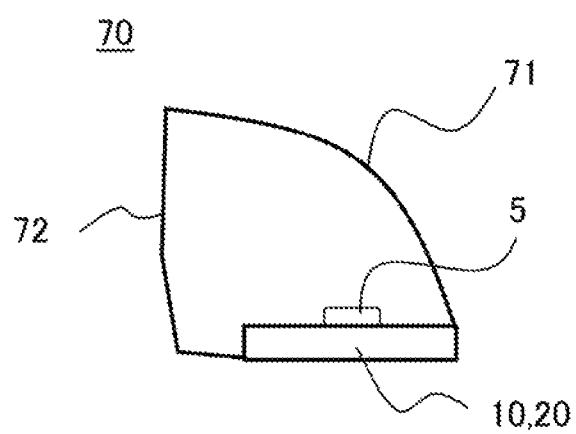
FIG. 7 is a cross-section view of a headlight including a wiring substrate according to a present embodiment.

Additionally, the wiring substrates 10 and 20 can be used in a headlight 70 for vehicles or bikes shown in FIG. 7.

FIG. 7 is a cross-section view of a headlight 70.

The headlight 70 includes a reflector (mirror) 71, the wiring substrate 10 or 20, and a lens 72.

The light emitted from an LED, namely a heat-producing component 5 placed on the wiring substrate 10 or 20, is reflected on the reflector 71, passes through the lens 72, and then, is radiated outward.

The disclosure is useful in vehicle illumination equipment and industrial apparatuses including high-power LEDs, electric convertors such as DC-DC convertors and DC-AC invertors that include power devices carrying out high-current operations, and System LSIs carrying out high-frequency operations.

What is claimed is:

1. A wiring substrate, comprising:
   an insulation resin layer having a top surface, a bottom surface and a side surface;
   a conductor-wiring layer that is placed on the top surface of the insulation resin layer; and
   a metal substrate that is placed on the bottom surface of the insulation resin layer, the metal substrate covering at least a portion of the side surface of the insulation resin layer, the side surface of the insulation resin layer forming an outside edge of the insulation resin layer.

2. The wiring substrate according to claim 1, wherein the edge of the insulation resin layer has a surface that is inclined against the top and bottom surfaces of said insulation resin layer.

3. The wiring substrate according to claim 1, wherein the edge of the insulation resin layer has a surface that is vertical to the top and bottom surfaces of said insulation resin layer.

4. The wiring substrate according to claim 1, wherein a corner of the edge of the insulation resin layer is covered by the metal substrate.

5. The wiring substrate according to claim 1, further comprising a heat-producing component placed on the conductor-wiring layer.

6. The wiring substrate according to claim 5, wherein the heat-producing component is an LED.

7. The wiring substrate according to claim 5, wherein a part of the edge of the insulation resin layer in a vicinity of the heat-producing component is covered by the metal substrate.

8. The wiring substrate according to claim 1, wherein an entire periphery of the side surface of the insulation resin layer is covered by the metal substrate.

9. A headlight, comprising the wiring substrate according to claim 1.

* * * * *